US006274885B1

United States Patent
Yamazaki et al.

(10) Patent No.: US 6,274,885 B1
(45) Date of Patent: Aug. 14, 2001

(54) ACTIVE MATRIX DISPLAY DEVICE WITH TFTS OF DIFFERENT REFRACTIVE INDEX

(75) Inventors: Shunpei Yamazaki, Tokyo; Naoto Kusumoto; Koichiro Tanaka, both of Kanagawa, all of (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 09/468,323

(22) Filed: Dec. 21, 1999

Related U.S. Application Data

(62) Division of application No. 08/572,104, filed on Dec. 14, 1995.

(30) Foreign Application Priority Data

Dec. 16, 1994 (JP) .................................................. 6-333876

(51) Int. Cl.⁷ .................................................. H01L 29/00
(52) U.S. Cl. .............................. 257/59; 257/72; 257/347; 257/348; 257/349; 257/350; 257/351; 25/312; 25/353; 25/354; 25/355; 251/59; 251/60; 251/61; 251/62; 251/63; 251/64; 251/65; 251/66
(58) Field of Search .............................. 257/51–66, 347, 257/72

(56) References Cited

U.S. PATENT DOCUMENTS

| | | |
|---|---|---|
| 3,848,104 | 11/1974 | Locke . |
| 4,046,618 | 9/1977 | Chaudhari et al. . |
| 4,059,461 | 11/1977 | Fan et al. . |
| 4,083,272 | 4/1978 | Miller . |
| 4,160,263 | 7/1979 | Christy et al. . |
| 4,234,358 | 11/1980 | Celler et al. . |
| 4,249,960 | 2/1981 | Schnable et al. . |
| 4,266,986 | 5/1981 | Benton et al. . |

(List continued on next page.)

FOREIGN PATENT DOCUMENTS

| | | |
|---|---|---|
| 55-67132 | 5/1980 | (JP) . |
| 57-085262 | 5/1982 | (JP) . |
| 57-180173 | 11/1982 | (JP) . |
| 59-5624 | 1/1984 | (JP) . |
| 61-145819 | 7/1986 | (JP) . |
| 63-102265 | 5/1988 | (JP) . |
| 5-175235 | 7/1993 | (JP) . |
| 5-203977 | 8/1993 | (JP) . |

OTHER PUBLICATIONS

S. Caune et al., Appl. Surf Sci. 36(1989)597 "Combined CW laser and furnace anneal of a–Si in contact with some metals", 1989.

M. Wager et al., Appl. Surf. Sci., 43(1989)260 "Formation of P–n junctions . . . laser beam homogenization", 1989.

T. Nishimura et al., Jap. J. Appl. Phys., Supplement 22–1 22(1983)217 "Evaluation and control of grain boundaries in laser recrystallized polysilicon . . . ", 1983.

Primary Examiner—Fetsum Abraham
(74) Attorney, Agent, or Firm—Eric J. Robinson; Nixon Peabody LLP

(57) ABSTRACT

In producing a semiconductor device by annealing with laser light irradiation, while a linear laser light is scanned in a direction perpendicular to a line, the annealing is performed for a semiconductor material. In this state, since an anneal effect in a beam lateral direction corresponding to a line direction is 2 times or more different than that in the scanning direction, a plurality of semiconductor elements are formed along a line direction in which the linear laser light is irradiated. Also, a line direction connecting the source and drain region of a thin film transistor is aligned to the line direction of the linear laser light.

50 Claims, 5 Drawing Sheets

U.S. PATENT DOCUMENTS

| | | |
|---|---|---|
| 4,309,225 | 1/1982 | Fan et al. . |
| 4,328,553 | 5/1982 | Fredrickson et al. . |
| 4,341,569 | 7/1982 | Yaron et al. . |
| 4,370,175 | 1/1983 | Levatter . |
| 4,439,245 | 3/1984 | Wu . |
| 4,463,028 | 7/1984 | Laude . |
| 4,468,551 | 8/1984 | Neiheisel . |
| 4,469,551 | 9/1984 | Laude . |
| 4,545,823 | 10/1985 | Drowley . |
| 4,734,550 | 3/1988 | Imamura et al. . |
| 4,764,485 | 8/1988 | Loughran et al. . |
| 4,803,528 | 2/1989 | Pankove . |
| 4,835,704 | 5/1989 | Eichelberger et al. . |
| 4,862,227 | 8/1989 | Tsuge et al. . |
| 4,937,618 | 6/1990 | Ayata et al. . |
| 4,942,058 | 7/1990 | Sano . |
| 4,956,539 | 9/1990 | Uesugi et al. . |
| 4,970,366 | 11/1990 | Imatou et al. . |
| 5,217,921 | 6/1993 | Kaido et al. . |
| 5,219,786 | 6/1993 | Noguchi . |
| 5,221,365 | 6/1993 | Noguchi et al. . |
| 5,247,375 | 9/1993 | Mochizuki et al. . |
| 5,313,076 | 5/1994 | Yamazaki et al. . |
| 5,352,291 | 10/1994 | Zhang . |
| 5,365,875 | 11/1994 | Asai et al. . |
| 5,372,836 | 12/1994 | Imahashi et al. . |
| 5,413,958 | 5/1995 | Imahashi et al. . |
| 5,424,230 | 6/1995 | Wakai . |
| 5,424,244 | 6/1995 | Zhang et al. . |
| 5,432,122 | 7/1995 | Chae . |
| 5,477,073 | 12/1995 | Wakai et al. . |
| 5,561,081 | 10/1996 | Takenouchi et al. . |
| 5,572,046 | 11/1996 | Takemura . |
| 5,578,520 | 11/1996 | Zhang et al. . |
| 5,589,406 | 12/1996 | Kato et al. . |
| 5,612,251 | 3/1997 | Lee . |
| 5,622,814 | 4/1997 | Miyata et al. . |
| 5,648,277 | 7/1997 | Zhang et al. . |
| 5,696,003 | 12/1997 | Makita et al. . |
| 5,708,252 | 1/1998 | Shinohara et al. . |
| 5,712,191 | 1/1998 | Nakajima et al. . |
| 5,736,414 | 4/1998 | Yamaguchi . |
| 5,756,364 | 5/1998 | Tanaka et al. . |
| 5,858,473 | 1/1999 | Yamazaki et al. . |
| 6,060,725 * | 5/2000 | Zhang et al. ................... 257/66 |

* cited by examiner

US 6,274,885 B1

ACTIVE MATRIX DISPLAY DEVICE WITH TFTS OF DIFFERENT REFRACTIVE INDEX

This application is a Divisional of application Ser. No. 08/572,104 filed Dec. 14, 1995.

BACKGROUND OF THE INVENTION

The present invention relates to a method for integrating devices (elements) such as transistors by using thin film semiconductor, and more particularly to a method for producing plural thin film devices by using a linear laser beam with no dispersion of characteristics thereof, and also to a thin film device produced by the technique.

Recently, various studies have been increasingly made on reduction in a temperature of a producing process of semiconductor devices because it is required that semiconductor devices must be formed on an insulating substrate such as glass which is low in cost and has high processability. The reduction of the producing process temperature of semiconductor devices is also required to promote microstructure design of devices and multilayer structure of devices.

In a semiconductor producing process, it is often required to perform crystallization of amorphous components contained in a semiconductor material or an amorphous semiconductor material, restoration of crystallinity of a semiconductor material which is originally crystalline, but reduced in crystallinity due to irradiation of ions, or further improvement of crystallinity of a semiconductor material having crystalline. For these requirements, thermal annealing is utilized. When silicon is used as a semiconductor material, the crystallization of amorphous material (components), the restoration of crystallinity, the improvement of crystallinity and the like are performed by annealing at 600° C. to 1100° C. for 0.1 to 48 hours or more.

In the thermal annealing, the processing time may be set to a shorter value as the process temperature increases, however, no effect can be obtained at 500° C. or less. Thus, for the reduction of the process temperature, it is required to replace the process based on the thermal annealing by another method. In particular, when a glass substrate is used, since the heat resistance temperature of the glass substrate is about 600° C., the other method is required to be comparable with the conventional thermal annealing at the process temperature of 600° C. or less.

As a method of satisfying the requirement is known a technique of performing various annealing treatments by irradiating a laser light to a semiconductor material. Much attention is paid to the laser light irradiation technique as a ultimate low temperature process. This is because the laser light can be irradiated into only a desired limited portion with high energy which is comparable with the energy of the thermal annealing, and also it is not needed to expose the overall substrate to a high temperature.

Two methods have been mainly proposed for the laser light irradiation. In a first method, a continuous oscillation laser such as an argon ion laser is used to irradiate a spot-shaped beam onto a semiconductor material. The semiconductor material is melted and then gradually solidified due to the difference of an energy distribution within a beam and the movement of the beam, to crystallize the semiconductor material. In a second method, a large energy laser pulse is irradiated onto a semiconductor material using a pulse oscillation laser such as an excimer laser, and then the semiconductor material is instantaneously melted and solidified to progress crystal growth of the semiconductor material.

The first method has a problem that the processing needs a long time. This is because the maximum energy of the continuous oscillation laser is limited and thus the size of the beam spot is set in mm-square order at maximum. The second method has extremely large maximum laser energy, and mass production can be more improved by using a spot beam of several centimeters square or more.

However, when a substrate having a large area is processed with a square or rectangular beam usually used, the beam must be moved in right and left directions and in up and down directions. Thus, it needs further improvement in mass production.

The great improvement can be performed by a method of deforming the beam in a line shape, setting the width of the beam to exceed the length of the substrate to be processed and scanning the beam relatively to the substrate. The term "scanning" means that the linear laser is superposedly irradiated while displaced little by little.

However, In the technique of superposedly irradiating the linear pulse laser while displaced little by little, stripes are necessarily formed on the surface of the semiconductor material to which the laser beam is irradiated. These stripes have a large effect on the characteristics of devices which are formed or will be formed on the semiconductor material. Particularly, this effect is critical when plural elements must be formed on a substrate so that the characteristic of each device is uniform. In such a case, the characteristic of each stripe is uniform, there occurs dispersion in characteristic between stripes.

There is a problem with respect to uniformity of the irradiation effect in the annealing using the line-shaped laser light. High uniformity means that the same device characteristics can be obtained over a substrate when devices are formed at any portions on the substrate. Improvement of uniformity means that crystallinity of a semiconductor material is made uniform. The following manner is used to improve the uniformity.

It has been known that, to moderate nonuniformity of the laser irradiation effect and improve its uniformity, it is better to preliminarily irradiate a weaker pulse laser light (hereinafter referred to as preliminary irradiation) before irradiation of an intense pulse laser light (hereinafter referred to as main irradiation). This effect is very high, and it can reduce the dispersion of the characteristics and thus remarkably improve the characteristics of a semiconductor device circuit.

The reason why the preliminary irradiation is effective to obtain the uniformity of a film resides in that a film of a semiconductor material containing an amorphous portion has such a property that the absorptance of the semiconductor material to laser energy is very different from that of a polycrystalline film or a single crystalline film. That is, a two stage irradiation acts as follows: the amorphous portion remaining in the film is crystallized by a first irradiation process, and then the whole crystallization is promoted by a second irradiation process. By promoting the crystallization moderately, the nonuniformity of stripes occurring on the semiconductor material due to the linear laser irradiation can be suppressed to some degree. Thus, the uniformity of the irradiation effect of the laser light can be remarkably improved, and the stripes are made visually relatively inconspicuous.

However, when a large number of (in several thousands or several ten thousands order) semiconductor devices such as thin film transistors (TFTs) are formed on a glass substrate, for example, in an active matrix type liquid crystal display, no satisfaction can be obtained in the uniformity of the effect even when the laser irradiation method based on the two stage irradiation is used.

As described above, the annealing using an excimer laser light which is processed into a linear beam is excellent from the viewpoint that it can be matched with a large area device design, however, it has a disadvantage in the uniformity of the effect.

SUMMARY OF THE INVENTION

An object of the present invention is to provide a technique of extremely suppressing dispersion of characteristics of each semiconductor device when a large number of semiconductor devices are formed by annealing with irradiation of a laser light processed into a linear beam.

Use of a linear laser beam necessarily causes striped nonuniformity. Thus, according to the present invention, the above problem can be overcome by converting a technical concept of improving the uniformity of a semiconductor material to a technical concept of conforming (matching) devices to be formed on or formed on the semiconductor material to nonuniformity due to laser irradiation.

FIG. 1 quantitatively shows a measurement result of nonuniformity which occurs on the surface of a semiconductor material due to the two stage irradiation of the laser light. A KrF excimer laser (wavelength of 248 nm, pulse width of 30 ns) processed into a linear beam of 1 mm width and 12 5 mm length is irradiated onto an amorphous silicon film of 500 Å thickness formed on a glass substrate while scanned in a direction perpendicular to the line of the beam, and then refractive index of the silicon film is measured.

In FIG. 1, a scan direction represents a refractive index distribution in the scan direction of the linear laser beam, that is, in the direction perpendicular to the line. A beam lateral direction represents a refractive index distribution in the line direction (longitudinal direction) of the linear laser beam. The amorphous silicon film is crystallized by irradiation of the laser light, and variation of crystallinity thereof can be measured on the basis of variation of refractive index thereof. The refractive index of the silicon film can be measured by an ellipsometer if the thickness of the thin film is known. The data in FIG. 1 are obtained when the two stage irradiation is performed.

From FIG. 1, uniformity of a refractive index is more excellent on a line parallel to the linear laser indicated by square marks than that on a line which is substantially vertical to the linear laser beam (the scanning direction of the laser light indicated by circular marks). The refractive index is closely related to crystallinity of the film, and no dispersion of refractive index means no dispersion of crystallinity. Thus, it is concluded that uniformity of crystallization on the line which is parallel to the linear laser is still better than that on the linear which is perpendicular to the linear laser. Also, the anneal effect due to the linear laser light is excellent in the line direction because there is no dispersion, however, there is large dispersion in the scan direction.

The dispersion in the line direction of the linear laser is about 0.6%. However, the dispersion in the scan direction is 1.3% which is above twice larger than 0.6%. Thus, when the annealing is performed with the linear laser beam while scanning the linear laser beam in the direction perpendicular to the line, the anneal effect in the line direction is above twice higher than that in the scan direction perpendicular to the line.

The same is expected to be satisfied for not only the silicon semiconductor thin films, but also for other thin film semiconductors. The effect due to the laser light irradiation in FIG. 1 is applied not only to crystallization of the amorphous silicon films, but also to crystallization of semiconductor thin films, increment and improvement of crystallinity, activation of doped impurities and the like.

The invention is more effective particularly when there is a double or larger difference between the anneal effect in the line direction and the anneal effect in the scan direction in various annealing treatments using linear laser beams.

When plural devices formed on semiconductor material are produced, a circuit design is set so that devices required to have the same characteristics are aligned in a line as much as possible, and a linear laser light is irradiated onto an device area (or an area which will become an device area) in which the devices are aligned to perform various annealing treatments. Thus, the anneal effect of the laser light can be made uniform over each device area in which devices are aligned, and the characteristics of the plural aligned devices have no dispersion.

When a crystal silicon film is formed with a linear laser beam having an anneal effect in FIG. 1 and then a thin film transistor (TFT) is formed using the crystal silicon film, the line connecting the source and drain of the TFT is set to coincide or substantially coincide with the line direction (longitudinal direction) of the linear laser light, whereby the crystallinity in a carrier moving direction can be made uniform. In this case, since carriers move in an area having uniform crystallinity, there is no obstacle (electrical obstacle) to the movement of the carriers and thus the characteristics can be improved.

In the invention, a semiconductor producing method includes the steps of, performing an annealing by irradiating a linear laser light onto a thin film semiconductor, and forming a plurality of semiconductor devices along the longitudinal direction of an area to which the linear laser light is irradiated.

The above steps are used, when TFTs are formed on a substrate having an insulating surface such as a glass substrate. The linear laser light may be formed by shaping an excimer laser light in a linear form through an optical system as indicated in an embodiment described later. The longitudinal direction along which the laser beam is irradiated means the line direction of the area on which the laser beam is irradiated in the linear form.

In the invention, the semiconductor producing method includes a step of irradiating a linear laser light to a thin film semiconductor, wherein the linear laser light is irradiated onto an area in which a plurality of semiconductor devices are aligned at least in a line so that the line direction of the linear laser light coincides with the alignment direction of the devices.

In the invention, the semiconductor producing method includes a step of irradiating a linear laser light to a thin film semiconductor, wherein the linear laser light having a linear pattern is irradiated along a direction which coincide with a direction connecting an area where the source region of a TFT is formed and an area where the drain region of the TFT is formed.

The TFT may be any one of a stagger type, an inverse-stagger type, a planar type and an inverse-planar type. It is particularly effective when a planar type TFT which each of source, channel and drain regions are formed in one active layer is used. The laser light is irradiated for crystallization, promotion of crystallization, improvement of crystallization, activation of impurities, and various annealing treatments.

In the invention, a semiconductor producing method includes the steps of, irradiating a linear laser light onto a thin film semiconductor, and forming a TFT having a source region and a drain region along the line direction of the linear laser light.

In the invention, a semiconductor producing method includes the steps of, irradiating a linear laser light onto a thin film semiconductor, and producing a semiconductor device in which carriers move along the line direction of the linear laser light.

In the invention, a semiconductor producing method includes the steps of, implanting an impurity ion for providing one conduction type into the source and drain regions of a TFT, and irradiating a linear laser light along a line connecting the source region and the drain region.

In the invention, a semiconductor device including a TFT of a crystal silicon film wherein refractive index dispersion of the crystalline silicon film in a first direction connecting source and drain regions of the TFT is above twice higher than that of the crystal silicon film in a second direction perpendicular to the first direction.

In the invention, a semiconductor device using a crystal silicon film, wherein refractive index dispersion of the crystal silicon film in a carrier moving direction in the semiconductor device is above twice higher than that of the crystal silicon film in a direction perpendicular to the carrier moving direction.

In annealing a semiconductor with a laser light having a linear beam pattern, the characteristics of plural thin films formed in the line direction of the laser pattern can be made uniform by using uniformity of an anneal effect in the line direction of the laser pattern.

The electrical characteristics of the semiconductor device can be improved by coinciding the carrier moving direction of the semiconductor device with the line direction of the line laser pattern. This is because carriers move in an area having uniform crystallinity.

The refractive index dispersion of the crystal silicon film in the carrier moving direction is set to be above twice higher than that in the direction perpendicular to the carrier moving direction, whereby a TFT having high characteristics can be obtained.

DETAILED DESCRIPTION OF THE PREFERRED EMBODIMENTS

Embodiment 1

In this embodiment, the present invention is applied in a case where an amorphous silicon film formed on a glass substrate is crystallized. A linear laser light is further irradiated onto a crystal silicon film crystallized by heat, to improve crystallinity. Also, thin film transistors (TFTs) having the same characteristics are formed with the crystal silicon film. Particularly, TFTs are integrated on a glass substrate to construct an active matrix type liquid crystal display device are produced.

Figure 2:
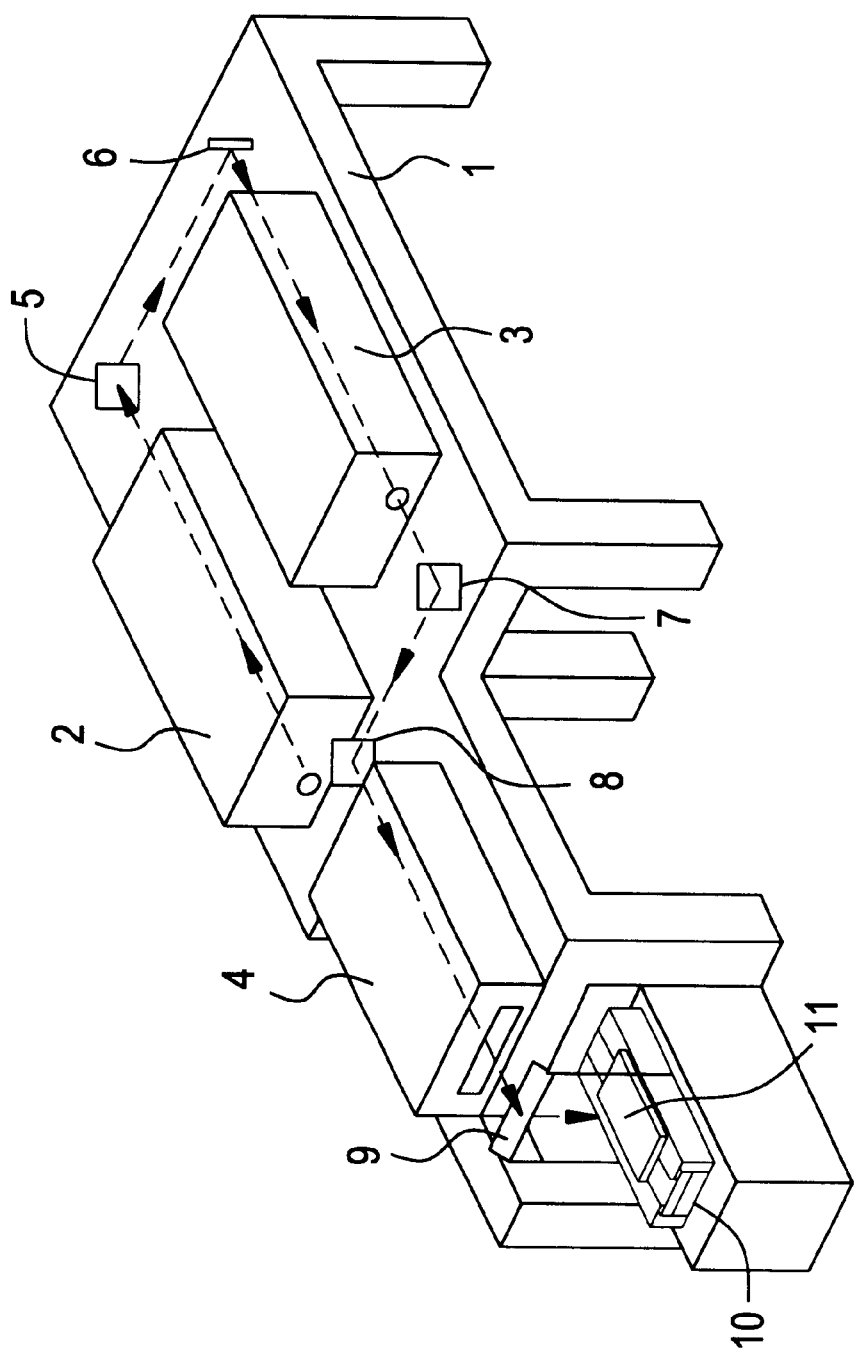
FIG. 2 is a schematic view of a laser light irradiating apparatus.

An apparatus for irradiating a laser light is described. FIG. 2 is a schematic view of a laser anneal apparatus in this embodiment. The laser light is oscillated by an oscillator 2. The laser light oscillated by the oscillator 2 is a KrF excimer laser (wavelength of 248 nm, pulse width of 30 ns). Other excimer lasers or other types of lasers may be used. The laser light oscillated by the oscillator 2 is amplified by an amplifier 3 through total reflection mirrors 5 and 6 and then enters an optical system 4 through total reflection mirrors 7 and 8. A machine (not shown) for putting in and out a light attenuating filter is placed between the mirror 8 and the optical system 4. The beam attenuating filter is used to obtain desired irradiation intensity by combining filters having different transmittance.

The beam pattern of the laser light immediately before entering the optical system 4 has a rectangular shape of about $3 \times 2$ cm$^2$. By passing the laser light through the optical system 4, a slender beam (linear beam) of 10 to 30 cm in length and about 0.1 to 1 cm in width can be obtained. The energy of the laser light passing through the optical system 4 is about 1000 m/shot at maximum.

The laser light is processed into such a slender beam to improve an irradiation efficiency. That is, after passing through the optical system 4, the linear beam is passed through a total reflection mirror 9, and then irradiated onto a substrate (sample) 11. In this case, by setting the width of the beam to be larger than the width of the substrate, the laser light can be irradiated onto the whole surface of the substrate by moving the substrate in one direction. Thus, a stage on which the substrate is placed and a driver device 10 therefor can be simplified in construction, and also maintenance thereof is easily performed. Also, positioning (alignment) for setting the substrate can be easily performed. Further, since the laser light can be irradiated onto the whole surface of an object by moving the substrate at only one direction, simplification of the laser light irradiation process and excellent controllability can be achieved.

The stage 10 on which the substrate 11 to be laser-irradiated is placed is controlled by a computer (not shown), and it is designed to move in a direction perpendicular to the linear laser light at a desired speed. If the stage on which the substrate is placed can rotate within the plane thereof, it is convenient for the change of a laser light scan direction. A heater is arranged below the stage 10 to keep the substrate at a desired temperature during irradiation of the laser.

Figure 3A:
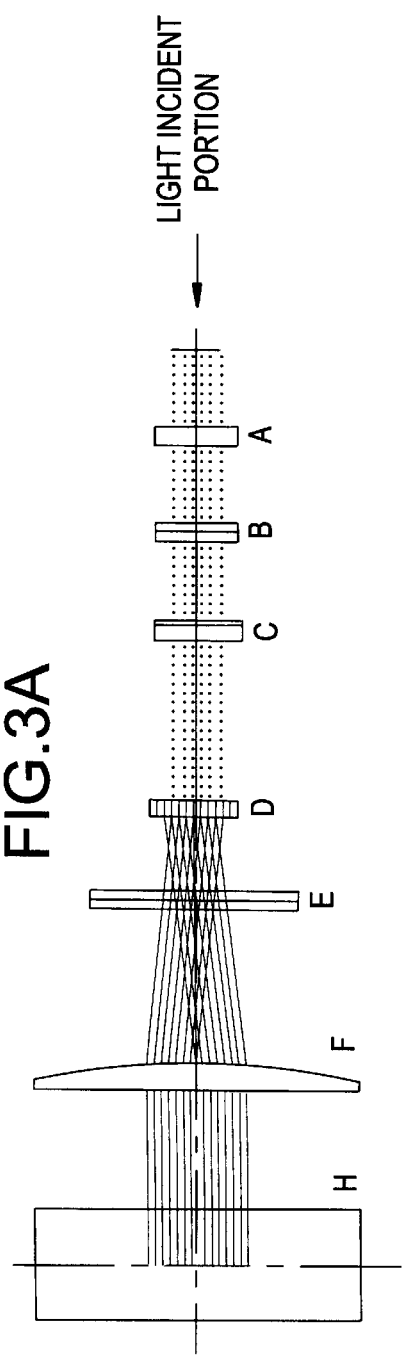
FIGS. 3A to 3C show an optical system for forming a laser light having a linear pattern.
Figure 3B:
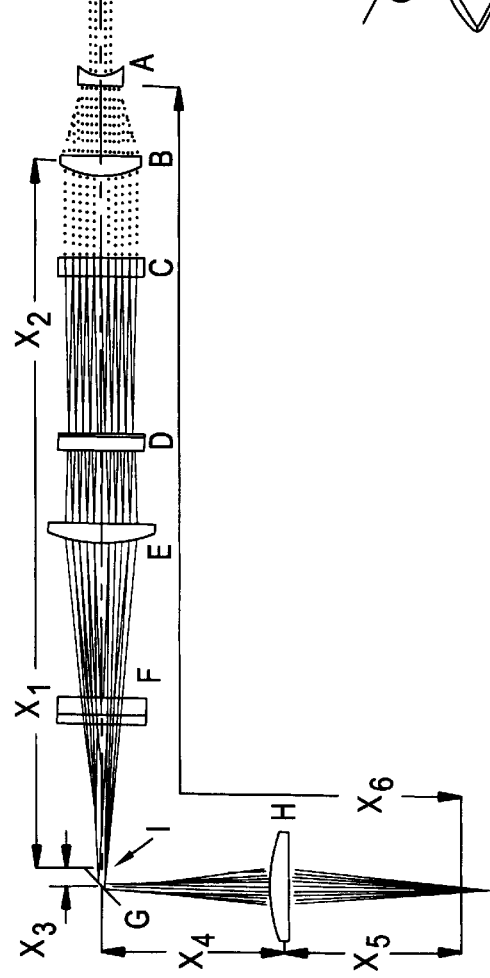
Figure 3C:
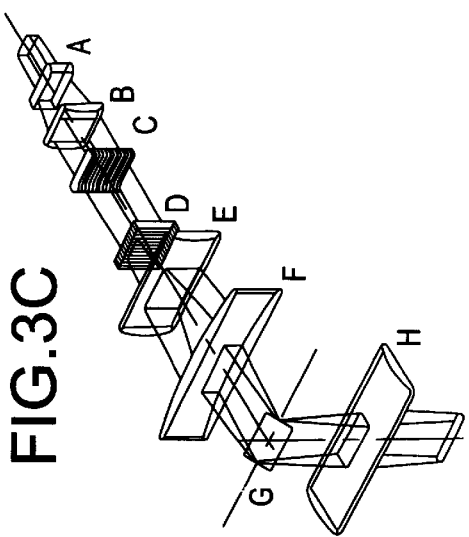

FIGS. 3A to 3C show an optical path in the optical system 4. FIG. 3A is an upper view of the optical path, and FIG. 2 is a side view thereof. The laser light incident into the optical system 4 passes through a cylindrical concave lens A, a cylindrical convex lens B and fly eye lenses C and D in a lateral direction, so that the laser light is changed from a gauss distribution type to a rectangular distribution type. The laser light passes through cylindrical convex lenses E and F and a mirror G, and then converged by a cylindrical lens H to obtain a linear laser light. In FIG. 2, the mirror G corresponds to the mirror 9. Also, the cylindrical lens H (not shown in FIG. 2) is disposed between the mirror 9 and the substrate (sample) 11.

A case wherein a crystalline silicon film is formed on a glass substrate by laser light irradiation is shown below. A glass substrate of 10 cm square (for example, Corning 7959 glass substrate or Corning 1737 glass substrate) is prepared.

A silicon oxide film is formed at a thickness of 2000 Å on a glass substrate by plasma CVD using TEOS as a raw material. The silicon oxide film functions as a base film to prevent diffusion of impurities from the glass substrate side into the semiconductor film.

An amorphous silicon film is formed at a thickness of 500 Å by plasma CVD or low pressure thermal CVD. The thickness may be set to a desired one.

The substrate is immersed in hydrogen peroxide ammonia and kept at 70° C. for 5 minutes to form a silicon oxide film on the surface of the amorphous silicon film. Further, a liquid-phase Ni acetate is applied onto the surface of the amorphous silicon film by spin coating. Ni element functions as an element to promote crystallization of the amorphous silicon film. It is required that the amount of the Ni element in the silicon film is $1 \times 10^{16}$ to $5 \times 10^{19}$ $cm^{-3}$. Specifically, the Ni concentration in the Ni acetate solution is adjusted to control the amount of the Ni element to be introduced into the silicon film. In the embodiment, Ni element is used, however, at least one of Fe, Co, Ru, Rh, Pd, Os, Ir, Pt, Cu and Au may be used in place of Ni.

The substrate is kept at 450° C. for one hour under a nitrogen atmosphere to eliminate hydrogen from the amorphous silicon film. This is because a threshold energy for a subsequent crystallization process is reduced by intentionally forming dangling bonds in the amorphous silicon film. By a heating treatment at 550° C. for 4 hours in a nitrogen atmosphere, the amorphous silicon film is crystallized. The crystallization temperature can be set to 550° C. by an action of Ni element. When the temperature of the heating treatment is 550° C., there is a little heat damage problem to the Corning 7059 glass substrate having a distortion point of 593° C. In general, it is necessary to perform the heating treatment at a temperature below the distortion point of a glass substrate to be used.

Through the above process, the crystalline silicon film on the substrate can be obtained. Also, KrF excimer laser (wavelength of 248 nm, pulse width of 25 ns) is irradiated onto the crystalline silicon film by the device of FIG. 2. The irradiation of the laser light further enhances the crystallinity.

When the crystalline silicon film is obtained by a heating treatment using a metal element for promoting crystallization of silicon, the obtained film contain a large amount of amorphous components therein although it has crystallinity. Thus, it is very effective to enhance the crystallinity of the film by irradiation of a laser light.

The laser light is shaped into a linear beam pattern by an optical system in FIGS. 3A to 3C, and assumed to be a linear laser light having a beam pattern of 125 mm×1 mm at an irradiated portion.

The substrate (sample) on which the silicon film is formed is placed on the stage 10. The laser light is irradiated onto the whole surface of the substrate by moving the stage at 2 mm/s. The moving speed of the stage 10 must be experimentally determined in accordance with film quality of the silicon film and a film forming condition.

A two stage irradiation is performed. That is, irradiation of 150 to 300 $mJ/cm^2$ is performed as preliminary irradiation and then irradiation of 200 to 400 $mJ/cm^2$ is performed as main irradiation. The pulse width is 30 ns, and the number of pulses is 30 pulses/s. The two stage irradiation is performed to suppress deterioration of uniformity of the film surface due to the laser light irradiation at maximum and thus form a film having good crystallinity.

Light attenuating filters are used in combination to convert the laser energy (for example, the energy conversion from the preliminary irradiation to the main irradiation). By this, the energy conversion can be performed for a shorter time than in a case where the energy of the laser oscillating device itself is adjusted.

When the laser light is irradiated, the substrate temperature is kept at 200° C. This is because the rate of rise-up and fall of the substrate surface temperature due to the irradiation of the laser light is moderated. In this embodiment, the substrate temperature is 200° C., however, it is practically selected from a temperature range of about 100° to 600° C. (the upper limit is restricted by the distortion point of the glass substrate), to obtain an optimum temperature for the laser annealing. An atmosphere control is not particularly performed, and the irradiation is performed under atmospheric air (pressure).

Thus, the crystal silicon film formed on the glass substrate is obtained. In the following description, TFTs used for an active matrix type liquid crystal display device are produced by the laser annealing.

Figure 4:
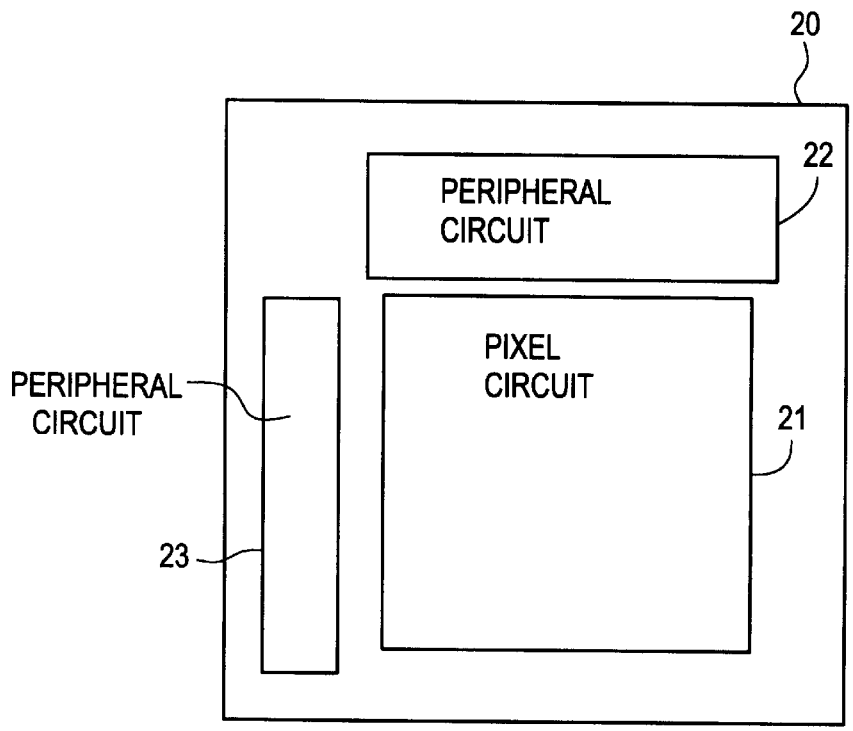
FIG. 4 is a schematic view of an active matrix type liquid crystal display device.

Usually, as shown in FIG. 4, the active type liquid crystal display device 20 has mainly a pixel portion 21 and peripheral circuit portions 22 and 23. At the pixel portion 20, pixel electrodes (several hundreds×several hundreds) are arranged in a matrix form, and at least one TFT is disposed as a switching element on each pixel. The peripheral circuit drives TFTS arranged in a pixel portion 21 and has a shift register circuit and a buffer circuit (output circuit having low impedance) for allowing current flow therethrough. The peripheral circuit is also constructed by mainly TFTS.

In this embodiment, the TFTs disposed in the pixel circuit and the TFTs disposed in the peripheral circuit are arranged in a line (alignment). Also, these TFTs are arranged so that the direction connecting the source with the drain coincides with the line direction of the linear laser light.

Figure 5:
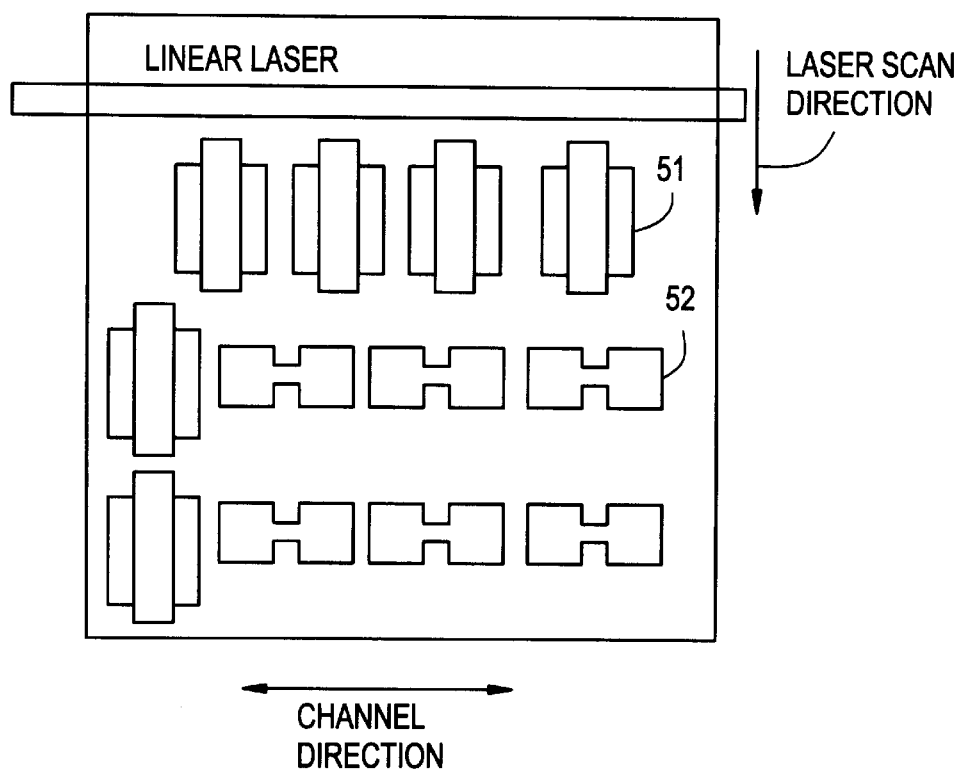
FIG. 5 shows a pattern of a thin film transistor (TFT) formed on a glass substrate and an irradiation state of a laser light.

FIG. 5 shows a pattern in which TFTs are actually arranged. In FIG. 5, numeral 51 represents a pattern of TFTs arranged in the peripheral circuit and can be driven at a large current. Numeral 52 represents a pattern of TFTs arranged in the pixel circuit. At the laser irradiation, the TFTs have not yet been formed. Thus, the patterns 51 and 52 may be regarded as a region on which the TFTs are finally formed.

Figure 6A:
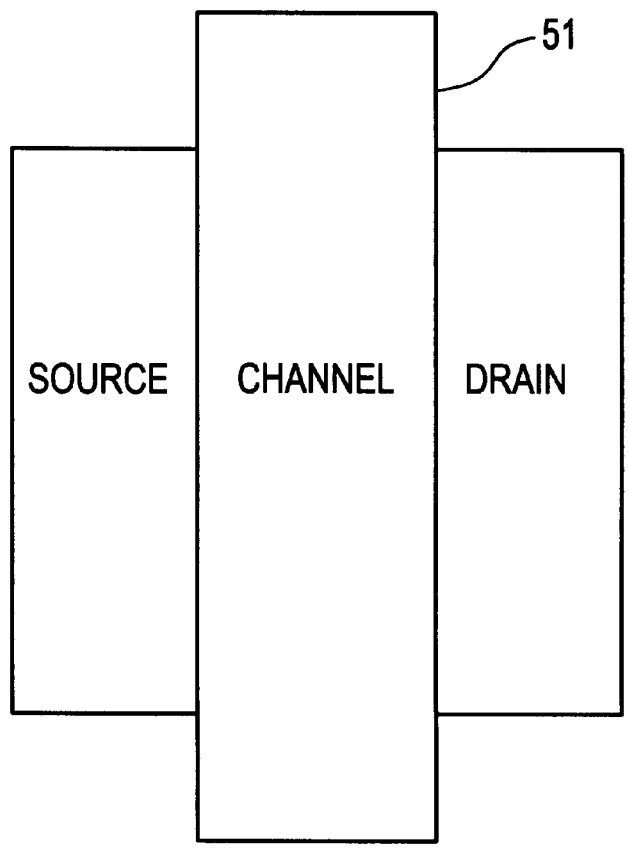
FIGS. 6A and 6B are a schematic view of a pattern of a TFT.
Figure 6B:
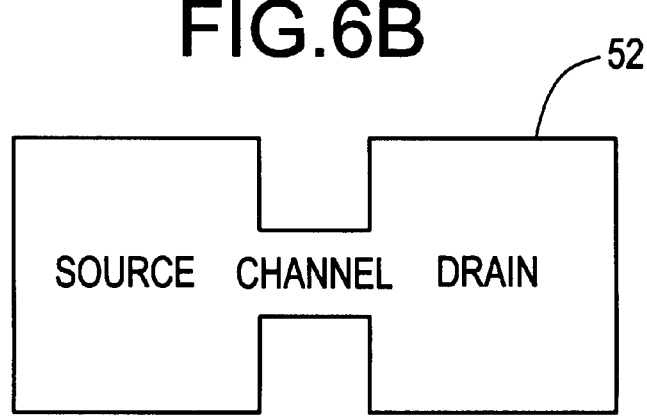

The TFTs 51 and 52 are shown in detail in FIGS. 6A and 6B. In FIGS. 6A and 6B, the TFTs are arranged in a line. The line connecting the source with the drain is set to be coincident or substantially coincident with the longitudinal direction of the linear laser light.

Figure 1:
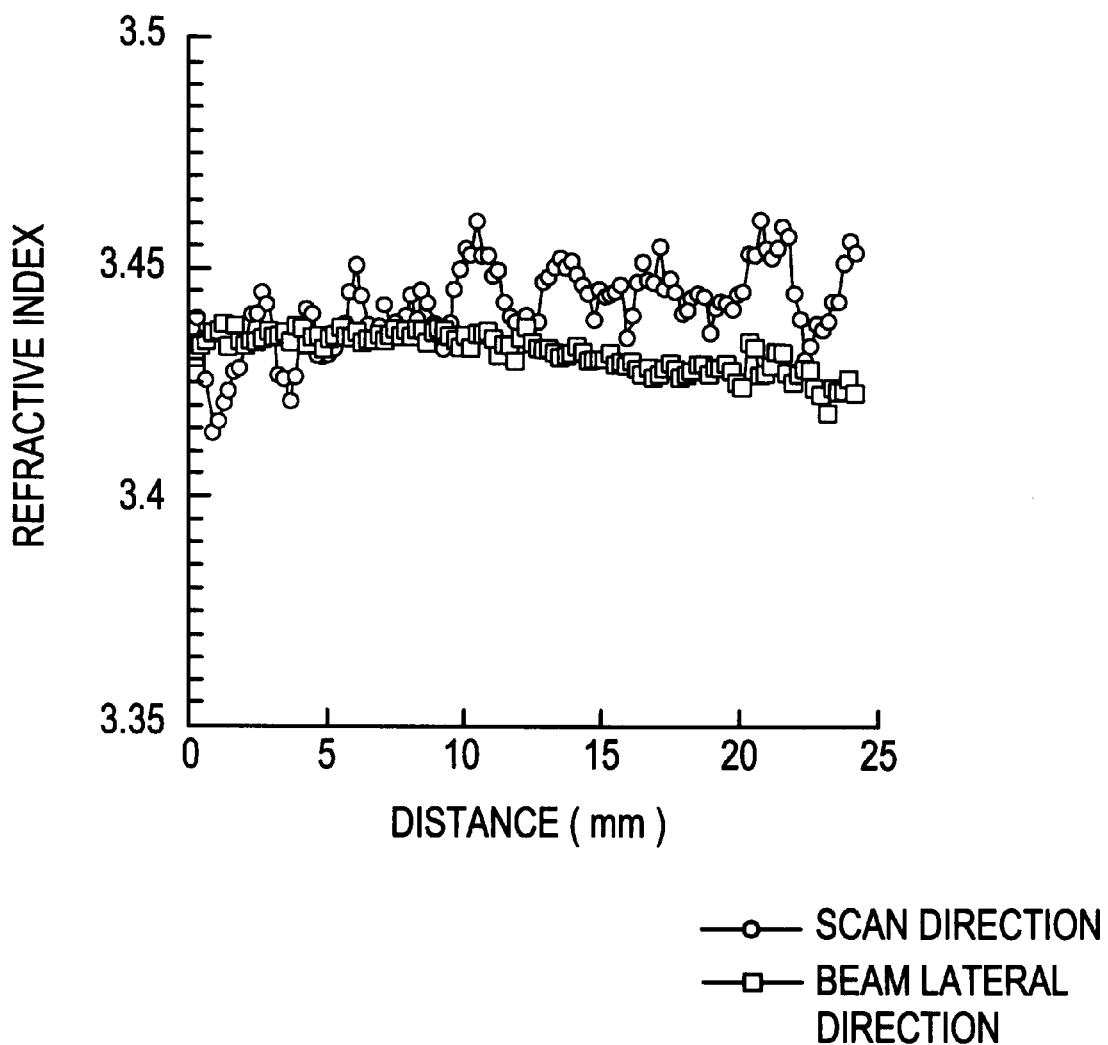
FIG. 1 shows a result of refractive index of a silicon film into which a linear laser light is irradiated.

When the linear laser light is irradiated in annealing of FIG. 1, the anneal effect in the line direction of the beam pattern is excellent uniformity. Thus, by aligning the TFTs in the longitudinal direction of the laser beam, the characteristics of the aligned TFTs can be made coincident with one another. Also, since carriers can move in a region having uniform crystallinity between the source and drain regions by aligning the line connecting the source and drain regions of each TFT to the longitudinal direction of the linear beam, high mobility can be obtained. The uniform crystallinity in the direction connecting the source with the drain means that the effect of trap levers due to discontinuity of a crystal state is small in the source/drain direction. The trap level effect causes problems such as enhancement of operational instability and increase of OFF current. Thus, it is effective for production of stable elements having low OFF current by reducing the effect of the trap levels in the direction connecting the source with the drain.

As described above, the two stage irradiation is used as the laser light irradiation method.

Embodiment 2

In this embodiment, a laser light is irradiated onto an amorphous silicon film formed on a glass substrate to obtain a crystalline silicon film, and TFTs constituting a pixel circuit portion and a peripheral circuit portion of an active matrix type liquid crystal display device are produced with the crystalline silicon film.

A silicon oxide film of 3000 Å thickness is formed as a base film on the glass substrate by sputtering. Also, an amorphous silicon film is formed at a thickness of 500 Å by plasma CVD or low pressure thermal CVD. In this state, a heating treatment is performed for one hour at 400° C. in a nitrogen atmosphere, to eliminate hydrogen from the amorphous silicon film.

The linear excimer laser light is irradiated onto the amorphous silicon film (in FIG. 5), to align the light to a linear region in which TFTs are to be formed in a line, so that a crystalline silicon film is obtained.

After the crystal silicon film is obtained, the TFTs are produced by a TFT producing process, so as to be aligned in such a state of FIG. 5. That is, the TFTs are aligned along the line direction of the irradiated linear laser, and the line connecting the source and drain regions of the aligned TFTs is coincident with the line direction of the linear laser light. The laser light is irradiated over the whole surface by the device of FIG. 2 while scanning.

Embodiment 3

In this embodiment, the present invention is applied to a process of activating source/drain regions required for a TFT producing process.

In a case where TFTs are formed with crystalline silicon film, when an impurity ion for providing one conductivity type, such as phosphorus or boron, is doped into source and drain regions by ion doping or plasma doping in a self-alignment using a gate electrode as a mask, the doped regions become amorphous or crystallinity thereof is remarkably reduced due to impact of an accelerated ion. Thus, an annealing process for restoring crystallinity of the source and drain regions is required. The doped impurity ion do not act as an impurity for controlling the conductivity type when no treatment is performed. Thus, annealing for activating the impurity ion is required.

The annealing process for the above purpose is conducted by irradiation of laser light. TFTs are formed with the crystalline silicon film, by the arrangement as shown in FIG. 5, according to the Embodiment 1 or 2. After the impurity ion is implanted into the source and drain regions of the TFTs, the linear laser light in FIG. 5 is irradiated. In this case, since the source and drain regions are disposed in the line direction of the linear laser, the anneal effect can be made uniform in one TFT. Also, since the direction along which the TFTs are arranged and the line direction of the linear laser light are coincident with each other, the anneal effect on each TFT can be made uniform.

In the embodiment, the TFTs constituting an active matrix type liquid crystal display device are produced. However, the present invention is applicable to a process of producing various integrated circuits. The present invention is not limited to the TFTs, and may be applied to the producing of various semiconductor devices such as thin film diodes, bipolar type transistors.

The effect of the invention is to suppress to the minimum the disadvantage due to nonuniformity of the characteristics of semiconductor materials which is caused in the process of irradiating the linear laser light onto the semiconductor material while scanning the light in one direction. That is, when plural thin film devices are formed with a semiconductor thin film in a liquid crystal display device, plural TFTs are arranged in a line, and the linear laser light is irradiated along the alignment direction, whereby the characteristics of each TFT can be matched with one another.

The linear laser light is irradiated while the direction of the source and drain regions of the TFT is coincident with the line direction of the linear laser light, whereby the crystal state in the carrier moving direction can be made uniform. Thus, TFTs each having high carrier mobility, a low OFF current value and stable characteristics.

The present invention is applicable to all laser treatment processes used for a semiconductor device process. Particularly, when it is used to produce TFT liquid crystal panels using TFTs as semiconductor devices, since the characteristics of each TFT can be made uniform, a liquid crystal display device having high quality can be obtained.

What is claimed is:

1. A semiconductor device having at least first thin film transistors arranged in a first direction and second thin film transistors arranged in a second direction perpendicular to the first direction formed over a same substrate, each of said first and second thin film transistors comprising:

a crystalline semiconductor film formed on an insulating surface;

a channel region formed in said crystalline semiconductor film;

source and drain regions formed in said crystalline semiconductor film wherein carriers flow through said channel region between said source and drain regions in a direction parallel to the first direction;

at least one gate electrode formed adjacent to said channel region with a gate insulating film interposed therebetween, and wherein variation of refractive indexes of said channel regions in said second thin film transistors is more than two times larger than that of said first thin film transistors.

2. A semiconductor device according to claim 1, wherein said refractive indexes are measured by an ellipsometer.

3. A semiconductor device according to claim 1, wherein said variation of refractive indexes of said channel regions in said second thin film transistors is about 1.3%.

4. A semiconductor device according to claim 1, wherein said variation of refractive indexes of said channel regions in said first thin film transistors is about 0.6%.

5. A semiconductor device according to claim 1, wherein each of said first and second thin film transistors is one of a stagger type, an inverse-stagger type, a planer type and an inverse-planer type.

6. A semiconductor device having at least first thin film transistors arranged in a first direction and second thin film transistors arranged in a second direction perpendicular to the first direction over a same substrate, each of said first and second thin film transistors comprising:

a crystalline semiconductor film formed on an insulating surface;

a channel region formed in said crystalline semiconductor film;

source and drain regions formed in said crystalline semiconductor film wherein carriers flow through said channel region between said source and drain regions;

at least one gate electrode formed adjacent to said channel region with a gate insulating film interposed therebetween, and wherein variation of refractive indexes of said channel regions in said second thin film transistors is larger than that of said first thin film transistors.

7. A semiconductor device according to claim 6, wherein said refractive indexes are measured by an ellipsometer.

8. A semiconductor device according to claim 6, wherein said variation of refractive indexes of said channel regions in said second thin film transistors is about 1.3%.

9. A semiconductor device according to claim 6, wherein said variation of refractive indexes of said channel regions in said first thin film transistors is about 0.6%.

10. A semiconductor device according to claim 6, wherein each of said first and second thin film transistors is one of a stagger type, an inverse-stagger type, a planer type and an inverse-planer type.

11. A semiconductor device having at least first thin film transistors arranged in a first direction and second thin film transistors arranged in a second direction perpendicular to the first direction over a same substrate, each of said first and second thin film transistors comprising:

a crystalline semiconductor film formed on an insulating surface, wherein said crystalline semiconductor film is obtained by an irradiation of a linear-shaped laser beam having an elongated cross section while moving said substrate in a direction orthogonal to an elongation direction of the cross section;

a channel region formed in said crystalline semiconductor film;

source and drain regions formed in said crystalline semiconductor film wherein carriers flow through said channel region in a direction parallel to the first direction;

at least one gate electrode formed adjacent to said channel region with a gate insulating film interposed therebetween, and wherein variation of refractive indexes of said channel regions in said second thin film transistors is more than two times larger than that of said first thin film transistors.

12. A semiconductor device according to claim 11, wherein said refractive indexes are measured by an ellipsometer.

13. A semiconductor device according to claim 11, wherein said variation of refractive indexes of said channel regions in said second thin film transistors is about 1.3%.

14. A semiconductor device according to claim 11, wherein said variation of refractive indexes of said channel regions in said first thin film transistors is about 0.6%.

15. A semiconductor device according to claim 11, wherein each of said first and second thin film transistors is one of a stagger type, an inverse-stagger type, a planer type and an inverse-planer type.

16. A semiconductor device having at least first thin film transistors arranged in a first direction and second thin film transistors arranged in a second direction perpendicular to the first direction, each of said first and second thin film transistors comprising:

a crystalline semiconductor film formed on an insulating surface, wherein said crystalline semiconductor film is obtained by an irradiation of a linear-shaped laser beam having an elongated cross section while moving said substrate in a direction orthogonal to an elongation direction of the cross section;

a channel region formed in said crystalline semiconductor film;

source and drain regions formed in said crystalline semiconductor film wherein carriers flow through said channel between said source and drain regions;

at least one gate electrode formed adjacent to said channel region with a gate insulating film interposed therebetween, and wherein variation of refractive indexes of said channel regions in said second thin film transistors is larger than that of said first thin film transistors.

17. A semiconductor device according to claim 16, wherein said refractive indexes are measured by an ellipsometer.

18. A semiconductor device according to claim 16, wherein said variation of refractive indexes of said channel regions in said second thin film transistors is about 1.3%.

19. A semiconductor device according to claim 16, wherein said variation of refractive indexes of said channel regions in said first thin film transistors is about 0.6%.

20. A semiconductor device according to claim 16, wherein each of said first and second thin film transistors is one of a stagger type, an inverse-stagger type, a planer type and an inverse-planer type.

21. A display device having an active matrix region including at least first thin film transistors arranged in a first direction and second thin film transistors arranged in a second direction perpendicular to the first direction over a same substrate, each of said first and second thin film transistors comprising:

a crystalline semiconductor film formed on an insulating surface;

a channel region formed in said crystalline semiconductor film;

source and drain regions formed in said crystalline semiconductor film wherein carriers flow through said channel region between said source and drain regions in a direction parallel to the first direction;

at least one gate electrode formed adjacent to said channel region with a gate insulating film interposed therebetween, and wherein variation of refractive indexes of said channel regions in said second thin film transistors is more than two times larger than that of said first thin film transistors.

22. A display device according to claim 21, wherein said refractive indexes are measured by an ellipsometer.

23. A display device according to claim 21, wherein said variation of refractive indexes of said channel regions in said second thin film transistors is about 1.3%.

24. A display device according to claim 21, wherein said variation of refractive indexes of said channel regions in said first thin film transistors is about 0.6%.

25. A display device according to claim 21, wherein each of said first and second thin film transistors is one of a stagger type, an inverse-stagger type, a planer type and an inverse-planer type.

26. A display device having an active matrix region including at least first thin film transistors arranged in a first direction and second thin film transistors arranged in a second direction perpendicular to the first direction over a same substrate, each of said first and second thin film transistors comprising:

a crystalline semiconductor film formed on an insulating surface;

a channel region formed in said crystalline semiconductor film;

source and drain regions formed in said crystalline semiconductor film wherein carriers flow through said channel region between said source and drain regions;

at least one gate electrode formed adjacent to said channel region with a gate insulating film interposed therebetween, and wherein variation of refractive indexes of said channel regions in said second thin film transistors is larger than that of said first thin film transistors.

27. A display device according to claim 26, wherein said refractive indexes are measured by an ellipsometer.

28. A display device according to claim 26, wherein said variation of refractive indexes of said channel regions in said second thin film transistors is about 1.3%.

29. A display device according to claim 26, wherein said variation of refractive indexes of said channel regions in said first thin film transistors is about 0.6%.

30. A display device according to claim 26, wherein each of said first and second thin film transistors is one of a stagger type, an inverse-stagger type, a planer type and an inverse-planer type.

31. An active matrix display device having a shift register including at least first thin film transistors arranged in a first direction and second thin film transistors arranged in a second direction perpendicular to the first direction over a same substrate, each of said first and second thin film transistors comprising:
- a crystalline semiconductor film formed on an insulating surface;
- a channel region formed in said crystalline semiconductor film;
- source and drain regions formed in said crystalline semiconductor film wherein carriers flow through said channel region between said source and drain regions in a direction parallel to the first direction;
- at least one gate electrode formed adjacent to said channel region with a gate insulating film interposed therebetween, and
- wherein variation of refractive indexes of said channel regions in said second thin film transistors is more than two times larger than that of said first thin film transistors.

32. An active matrix display device according to claim 31, wherein said refractive indexes are measured by an ellipsometer.

33. An active matrix display device according to claim 31, wherein said variation of refractive indexes of said channel regions in said second thin film transistors is about 1.3%.

34. An active matrix display device according to claim 31, wherein said variation of refractive indexes of said channel regions in said first thin film transistors is about 0.6%.

35. An active matrix display device according to claim 31, wherein each of said first and second thin film transistors is one of a stagger type, an inverse-stagger type, a planer type and an inverse-planer type.

36. An active matrix display device having a shift register including at least first thin film transistors arranged in a first direction and second thin film transistors arranged in a second direction perpendicular to the first direction, each of said first and second thin film transistors comprising:
- a crystalline semiconductor film formed over a substrate having an insulating surface;
- a channel region formed in said crystalline semiconductor film;
- source and drain regions formed in said crystalline semiconductor film wherein carriers flow through said channel region between said source and drain regions;
- at least one gate electrode formed adjacent to said channel region with a gate insulating film interposed therebetween, and
- wherein variation of refractive indexes of said channel regions in said second thin film transistors is larger than that of said first thin film transistors.

37. An active matrix display device according to claim 36, wherein said refractive indexes are measured by an ellipsometer.

38. An active matrix display device according to claim 36, wherein said variation of refractive indexes of said channel regions in said second thin film transistors is about 1.3%.

39. An active matrix display device according to claim 36, wherein said variation of refractive indexes of said channel regions in said first thin film transistors is about 0.6%.

40. An active matrix display device according to claim 36, wherein each of said first and second thin film transistors is one of a stagger type, an inverse-stagger type, a planer type and an inverse-planer type.

41. An active matrix display device having a buffer circuit including at least first thin film transistors arranged in a first direction and second thin film transistors arranged in a second direction perpendicular to the first direction over a same substrate, each of said first and second thin film transistors comprising:
- a crystalline semiconductor film formed on an insulating surface;
- a channel region formed in said crystalline semiconductor film;
- source and drain regions formed in said crystalline semiconductor film wherein carriers flow through said channel region between said source and drain regions in a direction parallel to the first direction;
- at least one gate electrode formed adjacent to said channel region with a gate insulating film interposed therebetween, and
- wherein variation of refractive indexes of said channel regions in said second thin film transistors is more than two times larger than that of said first thin film transistors.

42. An active matrix display device according to claim 41, wherein said refractive indexes are measured by an ellipsometer.

43. An active matrix display device according to claim 41, wherein said variation of refractive indexes of said channel regions in said second thin film transistors is about 1.3%.

44. An active matrix display device according to claim 41, wherein said variation of refractive indexes of said channel regions in said first thin film transistors is about 0.6%.

45. An active matrix display device according to claim 41, wherein each of said first and second thin film transistors is one of a stagger type, an inverse-stagger type, a planer type and an inverse-planer type.

46. An active matrix display device having a buffer circuit including at least first thin film transistors arranged in a first direction and second thin film transistors arranged in a second direction perpendicular to the first direction over a same substrate, each of said first and second thin film transistors comprising:
- a crystalline semiconductor film formed on an insulating surface;
- a channel region formed in said crystalline semiconductor film;
- source and drain regions formed in said crystalline semiconductor film wherein carriers flow through said channel region between said source and drain regions;
- at least one gate electrode formed adjacent to said channel region with a gate insulating film interposed therebetween, and wherein variation of refractive indexes of said channel regions in said second thin film transistors is larger than that of said first thin film transistors.

47. An active matrix display device according to claim 46, wherein said refractive indexes are measured by an ellipsometer.

48. An active matrix display device according to claim 46, wherein said variation of refractive indexes of said channel regions in said second thin film transistors is about 1.3%.

49. An active matrix display device according to claim 46, wherein said variation of refractive indexes of said channel regions in said first thin film transistors is about 0.6%.

50. An active matrix display device according to claim 46, wherein each of said first and second thin film transistors is one of a stagger type, an inverse-stagger type, a planer type and an inverse-planer type.

* * * * *